(12) United States Patent
Cha

(10) Patent No.: US 8,953,368 B2
(45) Date of Patent: Feb. 10, 2015

(54) MAGNETIC MEMORY DEVICE HAVING BIDIRECTIONAL READ SCHEME

(71) Applicant: Soo-Ho Cha, Seoul (KR)

(72) Inventor: Soo-Ho Cha, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 26 days.

(21) Appl. No.: 13/967,466

(22) Filed: Aug. 15, 2013

(65) Prior Publication Data

US 2014/0119107 A1    May 1, 2014

(30) Foreign Application Priority Data

Oct. 25, 2012    (KR) .................. 10-2012-0119114

(51) Int. Cl.
*G11C 11/16*    (2006.01)

(52) U.S. Cl.
CPC ............ *G11C 11/16* (2013.01); *G11C 11/1673* (2013.01)
USPC ........ 365/158; 365/173; 365/209; 365/225.5; 365/230.07; 365/230.05

(58) Field of Classification Search
CPC ............................ G11C 11/16; G11C 11/1673
USPC ............ 365/173, 209, 225.5, 230.07, 230.05, 365/158
See application file for complete search history.

(56) References Cited

U.S. PATENT DOCUMENTS

| | | |
|---|---|---|
| 6,963,505 B2 | 11/2005 | Cohen |
| 7,221,585 B2 | 5/2007 | Bessho |
| 7,286,395 B2 | 10/2007 | Chen et al. |
| 7,511,992 B2 | 3/2009 | Ueda |
| 2006/0209600 A1* | 9/2006 | Le Phan .................. 365/189.01 |
| 2009/0129143 A1 | 5/2009 | Guo et al. |
| 2010/0302838 A1 | 12/2010 | Wang et al. |
| 2012/0030506 A1 | 2/2012 | Post et al. |

* cited by examiner

*Primary Examiner* — Jason Lappas
(74) *Attorney, Agent, or Firm* — Volentine & Whitt, PLLC

(57) ABSTRACT

A data reading method of a magnetic memory device includes generating read commands, supplying a read current to a selected magnetic memory element in a first direction and in turn in a second direction under different ones of the read commands, respectively, and sensing the magnitude of the read current flowing through the selected magnetic memory element to read data stored at the selected magnetic memory element.

19 Claims, 16 Drawing Sheets

MAGNETIC MEMORY DEVICE HAVING BIDIRECTIONAL READ SCHEME

PRIORITY STATEMENT

This U.S. non-provisional application claims priority under 35 U.S.C. §119 to Korean Patent Application No. 10-2012-0119114 filed Oct. 25, 2012, in the Korean Intellectual Property Office, the disclosure of which is hereby incorporated by reference in its entirety.

BACKGROUND

The inventive concept relates to a semiconductor memory device. More particularly, the inventive concept relates to a magnetic memory device, and to a read method of reading data stored in a magnetic memory device.

Volatile semiconductor memories such as dynamic random access memories (DRAMs) are widely used as main memory components of electronic devices such as mobile handheld devices or computers. However, volatile semiconductor memories like DRAMs lose their stored data when power to the DRAM is removed.

On the other hand, a magnetic random access memory (MRAM) is a nonvolatile type of memory that overcomes the drawbacks of a DRAM being a volatile memory. Not only is a MRAM nonvolatile, but it may have high-integration, high-speed, and low-power consumption characteristics. Therefore, MRAMs are highly regarded as next-generation semiconductor memory devices.

In general, a magnetic memory cell of a MRAM has an access transistor that performs a switching operation and a magnetic tunnel junction (MTJ) element to store data. The MTJ element is a type of magnetic memory element including two ferromagnetic substances, and whose magneto resistance (MR) depends on the magnetization directions of the two ferromagnetic substances. That is, the magneto resistance of the MTJ element can be changed by changing the magnetization directions of the two ferromagnetic substances. In a memory cell of an MRAM, data stored by the MTJ element may be determined to be, or "read" as, '1' or '0' based on the level of magneto resistance.

SUMMARY

According to one aspect of the inventive concept, there is provided a data reading method of a magnetic memory device which includes issuing a series of successive read commands, supplying a read current to a selected magnetic memory element in a first direction and in turn in a second direction under different ones of the read commands, respectively, and sensing the magnitude of the read current flowing through the selected magnetic memory element to read data stored at the selected magnetic memory element. Each of the read commands demands that data stored in the selected magnetic memory element be read. The direction in which the read current flows through the selected magnetic memory element is controlled and periodically changed between first and second opposite directions.

Before the direction in which the read current is changed from the first direction to the second direction, the read current is supplied to the selected magnetic memory element in the first direction in response to the issuance of a respective one of the read commands, and the magnitude of the current flowing from the selected magnetic memory element in the first direction is sensed to read data stored in the selected magnetic memory element. On the other hand, after the direction in which the read current is changed from the first direction to the second direction, the read current is supplied to the selected magnetic memory element in the second direction in response to the issuance of another of the read commands, and the magnitude of the current flowing from the selected magnetic memory element in the second direction is sensed to read data stored in the selected magnetic memory element.

According to another aspect of the inventive concept, there is provided a magnetic memory device that includes a read command generating unit that generates read commands, a memory cell array including a matrix of magnetic memory cells connected between bit and source lines, each of the magnetic memory cells including a magnetic memory element, a read circuit operatively connected to the read command generating unit so as to receive the read commands therefrom, and a control circuit operatively interconnected between the memory array and the read circuit, and in which the read circuit is configured to read data stored in a selected magnetic memory element of the memory cell array by supplying a read current to the selected magnetic memory element and sensing the magnitude of the read current flowing from the select magnetic memory element in response to one of the read commands, and the control circuit is configured to control the direction in which the read current is supplied to the selected magnetic memory element, and to periodically change the direction in which the read current is supplied through the selected magnetic memory element between first and second opposite directions in which the read current flows to and from the source line, respectively, to which the selected magnetic memory element is connected.

According to still another aspect of the inventive concept, there is provided a magnetic memory device that comprises a memory cell including a magnetic memory element having a variable resistance, and a selection device electrically connected to the magnetic memory element and operable to select the magnetic memory element during a read operation in which data stored in the element is to be read, a source line electrically connected to the magnetic memory element at a first end of the element, a read current driving circuit having a first node electrically connected to the magnetic memory element at a second end of the element, a first switch electrically connecting the first node and voltage source, and a second switch electrically connecting the first node to a ground, a read command generating unit that generates read commands, and a switching unit operatively connected to the read current drive circuit and operative to effect first and second switching operations in succession during the course of a read operation in which data stored in the magnetic memory element is read a number of times in response to the read commands. The first switching operation results in a state of the read current driving circuit in which the first switch is open and the second switch is closed, and the second switching operation results in a state of the read current driving circuit in which the second switch is open and the first switch is closed.

BRIEF DESCRIPTION OF THE FIGURES

The above and other objects and features will become apparent from the following detailed description of preferred embodiments of the inventive concept made with reference to the following figures, in which.

DETAILED DESCRIPTION OF THE PREFERRED EMBODIMENTS

Figure 1:
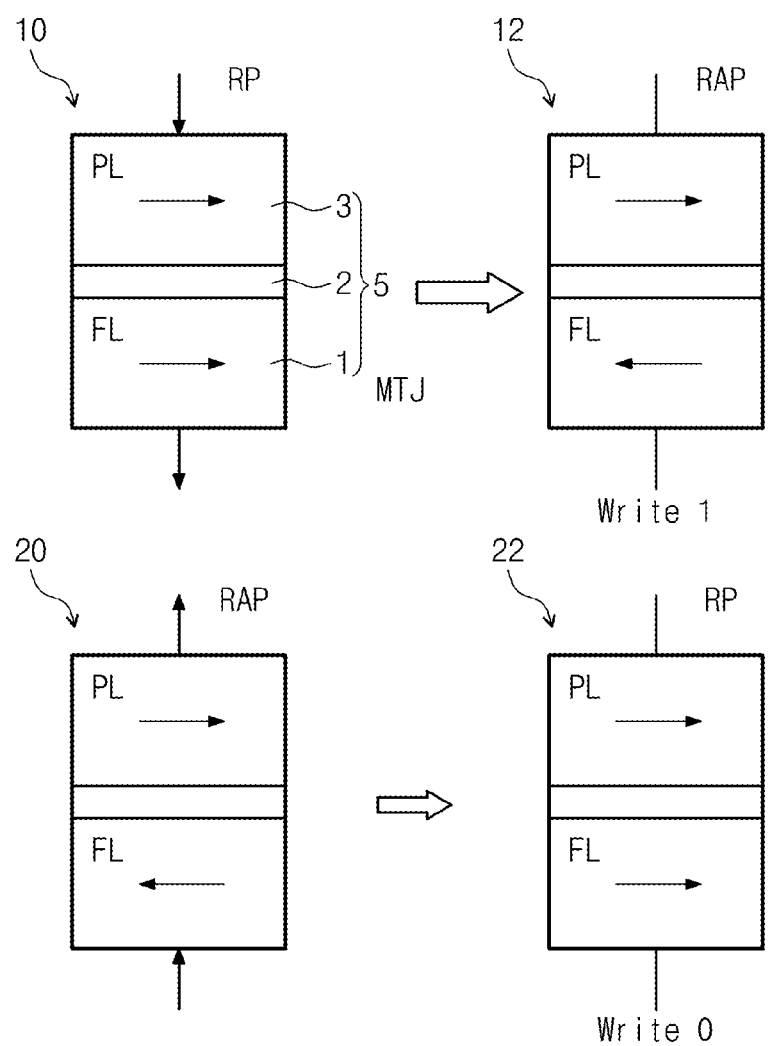
FIG. 1 a conceptual diagram illustrating changes in magnetization direction of a magnetic tunnel junction element of a magnetic memory cell in a write operation.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

However, certain details of data access operations and internal circuits of memory devices that are conventional per se may be omitted in the detailed description for the sake of brevity and clarity when it comes to the inventive concept.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

A magnetic tunnel junction (MTJ) element and a write operation of a magnetic memory cell having a magnetic tunnel junction (MTJ) element will now be described with reference to FIG. 1.

Referring to FIG. 1, magnetic tunnel junction (MTJ) element 5 (referred to hereinafter as "MTJ 5" for short) includes a pinned layer 3 and a free layer 1 each formed of a ferromagnetic material and separated by an insulation (or tunnel barrier) layer 2.

The magnitude of tunneling current flowing through the MTJ 5 (or tunneling resistance thereof) varies depending on magnetization states of the pinned layer 3 and the free layer 1. The MJT 5 may have minimum tunneling resistance when directions of magnetization of the pinned layer 3 and the free layer 1 are parallel and maximum tunneling resistance when magnetization directions of the pinned layer 3 and the free layer 1 are anti-parallel. The magnetization direction of the free layer 1 may be switched by changing an applied current and hence, a magnetic field produced.

In FIG. 1, the reference character "R" stands for resistance, reference character "P" stands for parallel, and reference character "AP" stands for anti-parallel.

In the case of the MTJ 5 having a low-resistance (RP) state as designated by a reference numeral 10, if a write current flows to the free layer 1 from the pinned layer 3, the magnetization direction of the free layer 1 is switched. In this case, as designated by a reference numeral 12, a state of the MTJ 5 is changed to a high-resistance (RAP) state. The operation in which the state of the MTJ 5 is switched to the high-resistance state from the low-resistance state is referred to as a reset operation, and data '1' is stored at a memory cell when the cell is subjected to such a reset operation.

In case of the MTJ 5 having the high-resistance (RAP) state as designated by reference numeral 20, if a write current flows to the pinned layer 3 from the free layer 1, a magnetization direction of the free layer 1 is switched. In this case, as designated by reference numeral 22, the state of the MTJ 5 is changed to the low-resistance state from the high-resistance state. The operation in which the state of the MTJ 5 is switched to the low-resistance state from the high-resistance state is referred to as a set operation, and data '0' is stored at a memory cell in a set operation.

Figure 2:
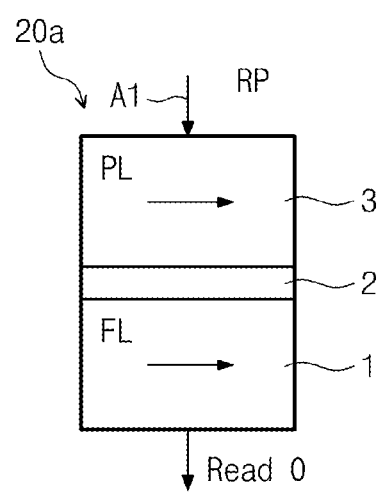
FIG. 2 is a conceptual diagram illustrating a typical method for reading data stored at a magnetic tunnel junction element.
Figure 2:
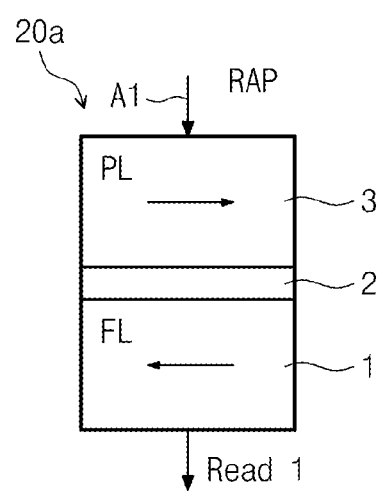

A typical method of reading data from the MTJ 5 storing '1' or '0' will now be described with reference to FIG. 2.

In a read operation in which an MTJ 5 having a low-resistance (RP) state is read, as designated by reference numeral 20a, a read current flows to a free layer 1 from a pinned layer 3 in direction A1. In this case, a read circuit may sense the low-resistance (RP) state of the MTJ 5 and thus "reads the data" stored by the MTJ 5 as '0'.

In a read operation in which the MTJ 5 having a high-resistance (RAP) state is read, as designated by a reference numeral 20b, a read current flows to the free layer 1 from the pinned layer 3 in direction A1 as well. In this case, the read circuit senses the high-resistance (RAP) state of the MTJ 5 and thus "reads the data" stored by the MTJ 5 as '1'.

In a read operation of a conventional memory device, a read current is iteratively applied to a memory cell in one direction.

Furthermore, an MTJ element of an MRAM may be temperature sensitive due to characteristics of the MTJ element. Accordingly, a read operation may cause characteristics of an MTJ element to deteriorate leading to an increase in the read error rate (RER). The read error rate (RER) becomes high when margins of write and read currents are insufficient and a distribution of the currents is wide.

A resistance characteristic of a magnetic tunnel junction (MTJ) element of the type shown in and described with reference to FIGS. 1 and 2 will now be described with reference to FIG. 3.

Figure 3:
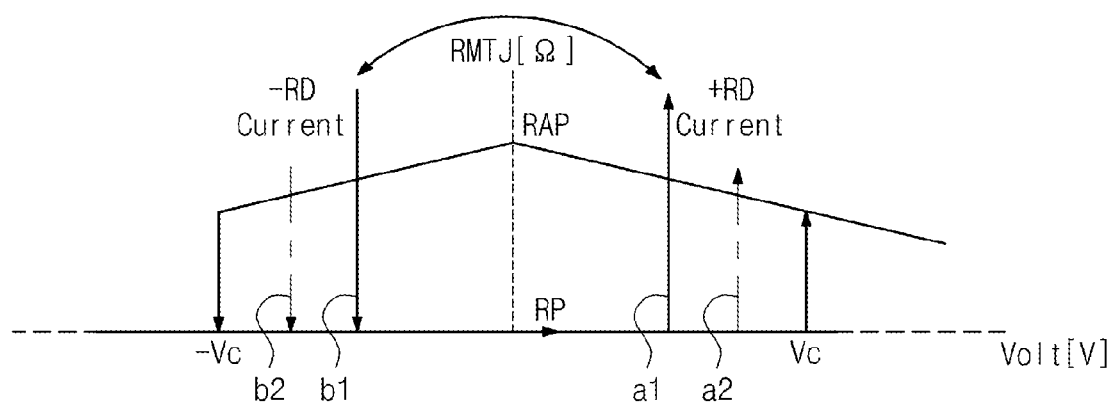
FIG. 3 is a graph showing the relationship between resistance, voltage and read current of magnetic tunnel junction elements employed according to the inventive concept.

In FIG. 3, voltage applied to the MTJ element is plotted along the horizontal axis and resistance R of the MTJ element is plotted along the vertical axis. Reference symbol 'a1' represents the relationship between resistance, voltage and positive read current in the MTJ element, and reference symbol 'b1' represents the relationship between resistance, voltage and negative read current in the MTJ element. Reference symbols 'a2' and 'b2' designate these relationships with respect to a dummy memory cell, as will be more fully described later with reference to the embodiment of FIGS. 7-9.

As can be understood from the graph of FIG. 3, a magnetic tunnel junction element of the type described above is bi-directional.

An example of a read operation according to the inventive concept will now be described with reference to FIG. 4. The term "read operation" will refer to a period of use of a memory device in which the data storage elements, in this case magnetic tunnel junction elements, are read a number of times upon being selected. In an example of this operation, a read current is alternately supplied to the selected magnetic tunnel junction element in both directions.

More specifically, referring to a first case ca1, when an MTJ 5 having an RP state is first read, the read current is selectively applied in one of two directions. In this example, the read current is supplied in a first direction A1 selected from among first A1 and second (B1) directions wherein the first direction is from the pinned layer PL to the free layer FL. Alternatively, when the MTJ 5 having an RP state is first read, the read current may be applied in the second direction (from the free layer FL to the pinned layer PL). For ease of description, the first direction may be referred to as a forward direction, and the second direction may be referred to as a reverse direction.

When the read current is applied in the first direction A1, a read circuit reads data stored at the MTJ 5 as '0' by sensing the magnitude of the current flowing from the MTJ 5.

Also, the direction (one of the first and second directions) in which the read current is supplied is selected according to whether a read command, input to a memory controller and which causes a memory cell to be read, is odd-numbered or even-numbered. In the example shown in FIG. 4, over an entire series of read commands, the read current is supplied in the forward direction when any one of the read commands is odd-numbered and in the reverse direction when any one of such read commands is even-numbered. However, the inventive concept is not so limited. Rather, the read current may be supplied in the forward direction whenever an even-numbered read command is input to the memory controller, and in the reverse direction whenever an odd-numbered read command is input to the memory controller.

To minimize or reduce a read error rate (RER) due to deterioration of a characteristic of the MTJ 5, the read current is applied in the second direction when the MTJ 5 having the RP state is read for a second time. That is, in the case of reading the MJT 5 having the RP state a second time, if the read current were supplied in the first direction A1 the state of the MTJ 5 could be changed to the RAP state as illustrated by arrow st1 due to the temperature sensitivity of the MTJ 5. For this reason, i.e., to prevent a change in the state of the MJT 5 when the MJT 5 is read a second time, the read current is supplied in the second direction B1.

Referring to a third case ca3 in which the MJT 5 having the RP state is read for a third time, the read current is supplied in the first direction A1. If the read current were supplied in the first direction A1 during the next read (the reading of the MJT 5 in the RP state a fourth time), the state of the MTJ 5 could change to the RAP state as illustrated by arrow st3. Accordingly, in the case in which the MJT 5 having the RP state is read a fourth time, in this example, the read current is supplied in the second direction B1 as in the "second read". Thus, a change in a characteristic of the MTJ 5 is prevented by supplying the read current in the second direction B1 in all even-numbered reads, as represented by arrow st2.

Figure 4:
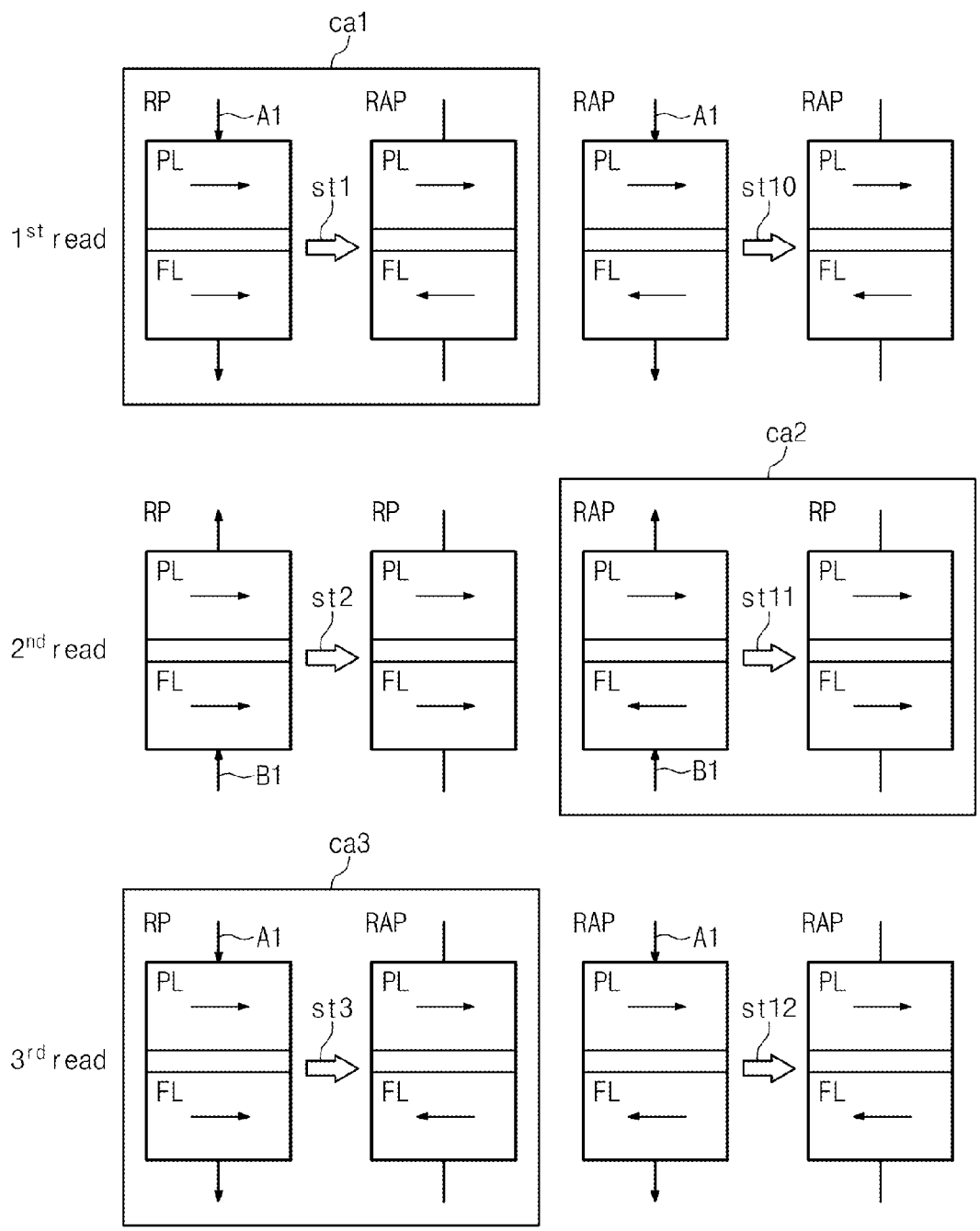
FIG. 4 is a conceptual diagram illustrating an embodiment of a read method according to the inventive concept.

Still referring to FIG. 4, the read current may supplied in the first direction A1 when the MJT 5 having the RAP state is first read. To minimize or reduce a read error rate (RER) when the MJT 5 having the RAP state is read a second time, the read current is supplied in the second direction B1 as illustrated in a second case ca2. If the read current were supplied in the first direction A1 in carrying out the second read, the state of the MTJ 5 could change to the RP state as illustrated by arrow st11. Accordingly, i.e., to prevent a deterioration of a characteristic of the MTJ 5 that results in a change in its state, the read current is supplied in the second direction B1 when the MJT 5 having the RAP state is read a second time.

The read current is supplied in the first direction A1 when the MJT 5 having the RAP state is read a third time. In the case that a fourth read operation is performed with respect to the MJT 5 having the RAP state, like the second read case, the read current is supplied in the second direction B1. Thus, changes in a characteristic of the MTJ 5, resulting in changes in the RAP state of the MJT 5 are prevented, as illustrated by arrows st10 and st12, by supplying the read current in the first direction A1 in all odd-numbered reads.

Figure 5:
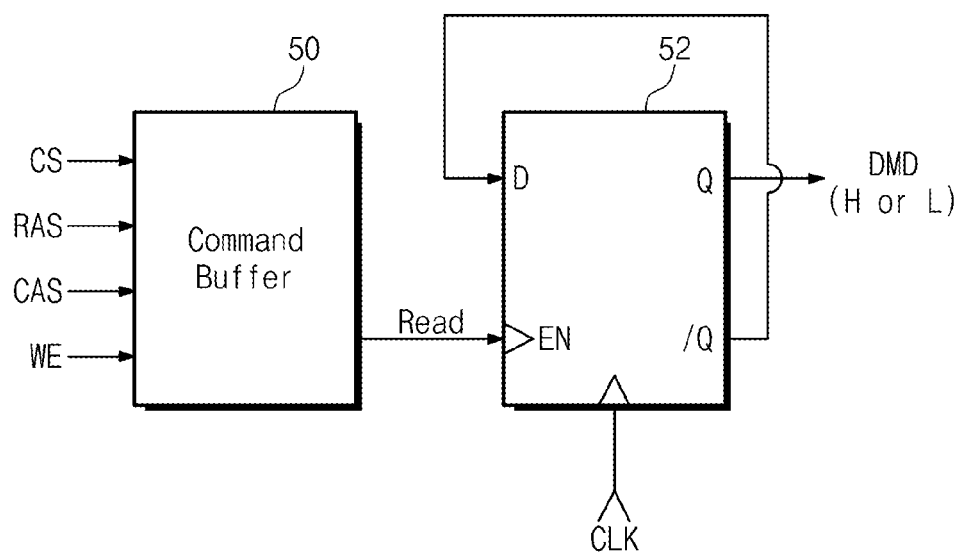
FIG. 5 is a block diagram of a switching signal generating unit for use in executing a read method according to the inventive concept.
Figure 6:
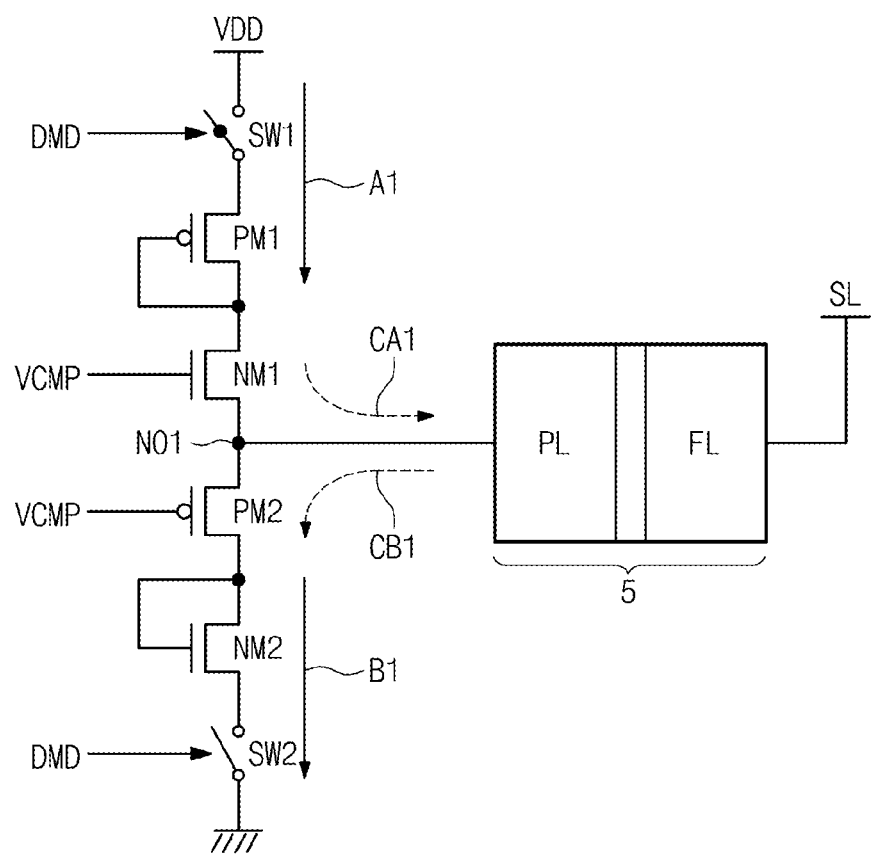
FIG. 6 is a circuit diagram of a read current driving circuit for use in executing a read method according to the inventive concept.

FIG. 5 illustrates an embodiment of a switching signal generating unit and FIG. 6 illustrates an embodiment of a read current driving circuit, for executing a read method described with reference to FIG. 4.

Referring to FIG. 5, the switching signal generating unit includes a command buffer 50 and a counter 52.

The command buffer 50 may output a read command in response to a chip selection signal CS, a row address strobe signal RAS, a column address strobe signal CAS, and a write enable signal WE received in a read operation. The counter 52 outputs a direction detection signal DMD indicating a direction of a current to be supplied to an MTJ in response to the read command. For example, when an odd-numbered read command in a series of read commands is output by the command buffer 52, the counter 52 outputs a direction detection signal DMD having a logic 'H' level. On the other hand, when an even-numbered read command is output by the command buffer 50, the counting unit 52 outputs a direction detection signal DMD having a logic 'L' level.

The direction detection signal DMD is applied to first and second switches SW1 and SW2 of the read current driving circuit shown in FIG. 6.

Referring to FIG. 6, the read current driving circuit of this embodiment includes a first direction current driving unit formed of a first switch SW1 and PMOS and NMOS transistors PM1 and NM1 and a second direction current driving unit formed of a second switch SW2 and PMOS and NMOS transistors PM2 and NM2.

An MTJ 5 is connected between a node NO1 of the read current driving unit and a source line SL.

When the direction detection signal DMD having a logic 'H' level is received, the first switch SW1 is closed and the second switch SW2 is opened. A gate of the NMOS transistor NM1 is connected (to a VCMP voltage source) to receive a clamping voltage VCMP causing current to flow in first direction A1. Thus, a read current may flow along a first flow path CA1 from a power supply voltage source VDD to the source line through the MTJ 5 in the first direction A1. This may be referred to as a forward current flow. In this case, an intermediate voltage between a write voltage and a ground voltage may be applied to the source line SL.

When the direction detection signal DMD having a logic 'L' level is received, the first switch SW1 is opened and the second switch SW2 is closed. A gate of the PMOS transistor PM2 is connected (to a VCMP voltage source) to receive a clamping voltage VCMP causing current to flow in second direction B1. Thus, a read current may flow along a second flow path CBl from the source line through SL to ground through the MTJ 5. This may be referred to as a reverse current flow.

That is, the circuit of FIG. 6 switches the direction of the read current applied to the MTJ 5 to the first direction from the second direction or to the second direction from the first direction when the level of the detection signal DMD generated upon the issuance of successive read commands changes.

According to an aspect of the inventive concept, the DMD signals generated when the odd-numbered read commands are issued are of one level, and the DMD signals generated when the odd-numbered read commands are issued are of another level. The direction in which the read current is supplied thus depends on whether the read command is an odd-numbered read command or an even-numbered read command. As a result, the direction in which the read current is supplied is alternated between the first and second directions.

In another embodiment of a read method according to the inventive concept, the direction in which the read current is supplied depends on a characteristic of a dummy cell that changes periodically during the course of a series of reads. The changes in the characteristic of the dummy cell are used to switch the direction in which the read current is supplied. This will be described more fully now with reference to the circuit diagrams of FIGS. 7 to 9.

Figure 7:
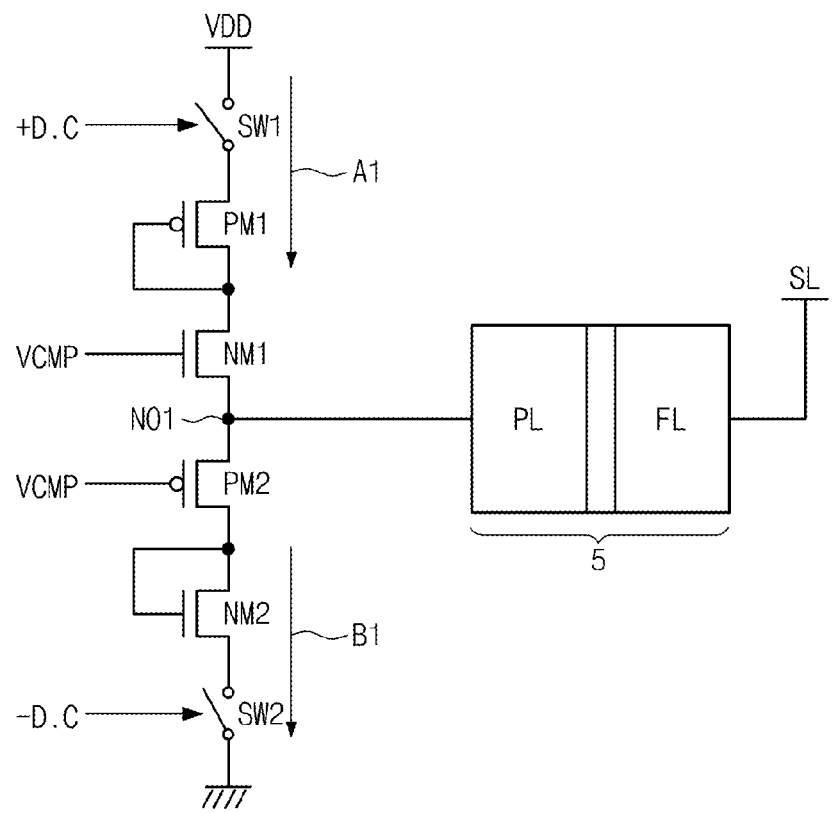
FIG. 7 is a circuit diagram of another embodiment of a read current driving circuit for use in executing a read method according to the inventive concept.

Referring to FIG. 7, a read current driving circuit includes a first direction current driving unit formed of a first switch SW1 and PMOS and NMOS transistors PM1 and NM1 and a second direction current driving unit formed of a second switch SW2 and PMOS and NMOS transistors PM2 and NM2.

An MTJ 5 is connected between a node NO1 of the read current driving unit and a source line SL. The first and second switches SW1 and SW2 operate responsive to the levels of first and second dummy cell sign detection signals +D.C and −D.C, respectively.

More specifically, when a first dummy cell sign detection signal +D.C of a logic level 'H' is produced in the circuit, the first switch SW1 is closed. A gate of the NMOS transistor NM1 is connected (to a VCMP voltage source) to receive a clamping voltage VCMP that causes a read current to flow in first direction A1. In this case, the switch SW2 is open and the read current flows through the MTJ 5 from a power supply voltage source VDD to the source line SL. That is, the read current may flow in a forward direction.

When the second dummy cell sign detection signal −D.C of a logic level 'L' is produced in the circuit, the second switch SW2 is closed. A gate of the PMOS transistor PM2 is connected (to a VCMP voltage source) to receive a clamping voltage VCMP that causes the read current to flow in the second direction B1. In this case, the first switch SW1 is open and the read current flows from the source line SL to a ground through the MTJ 5. That is, the read current flows in the reverse direction.

In this embodiment, the first and second switches SW1 and SW2 do not operate based on whether the read command is an even- or odd-numbered command in a sequence of successive read commands. Rather, the first and second switches SW1 and SW2 are operated based on a characteristic of a dummy memory cell which is fabricated in the circuit together with normal memory cells (the "normal" memory cells being those from which data is read and onto which data is written, and the dummy cell not being connected to the lines from which data is read from the normal memory cells).

Moreover, a characteristic of the dummy memory cell (namely, the voltage across the dummy memory cell) changes periodically to change the states of the switches SW1 and SW2 and hence, to change the direction in which a read current is supplied from the first direction to the second direction or from the second direction to the first direction. For example, a characteristic of the dummy memory cell change once a selected normal memory cell has been read in the first direction five hundred times. As a result, the read current is supplied in the second direction from the $501^{st}$ read to another set number of reads. For instance, a characteristic of the dummy memory cell changes once a selected normal memory cell has been read in the second direction six hundred times. As a result, the read current is then supplied in the first direction, i.e., another five hundred times from the $601^{st}$ read in the second direction. In other words, as long as a characteristic of the dummy memory cell has not changed, the read current is supplied in one of two directions (the first direction in this example) whenever a read command is received. After the characteristic of the dummy memory cell unit has changed, the read current is supplied in other direction (the second direction) whenever a read command is received.

Figure 8:
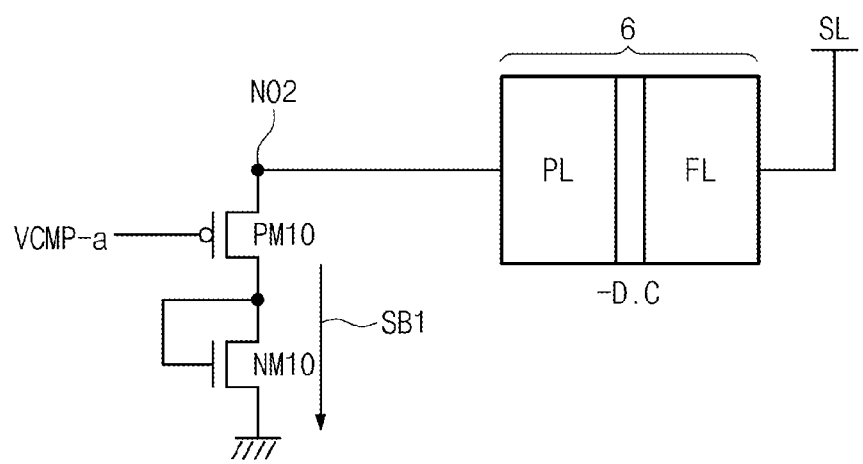
FIG. 8 is a circuit diagram of a first part of a dummy memory cell driving circuit for controlling the switches of the circuit of FIG. 7.
Figure 9:
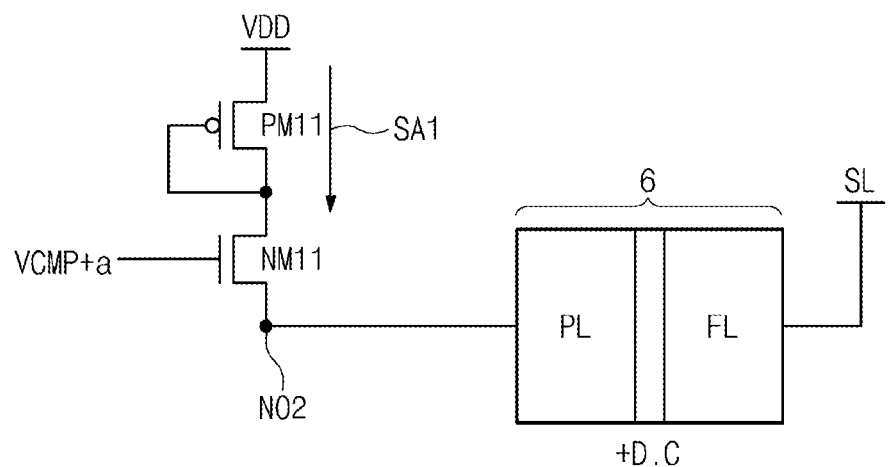
FIG. 9 is a circuit diagram of a second part of the dummy memory cell driving circuit for controlling the switches of the circuit of FIG. 7.

A dummy memory cell driving circuit will now be described with reference to FIGS. 8 and 9. In FIGS. 8 and 9, reference numeral 6 designates a dummy memory cell.

Referring first to FIG. 8, a gate of a PMOS transistor PM10 is connected (to a VCMP-a voltage source) to receive a clamping voltage VCMP-a that allows current to flow in the second direction SB1 in the circuit. The clamping voltage VCMP-a is lower than that of the clamping voltage VCMP applied to the normal memory cell. In this respect, the level of the voltage may be 0.1V, for example. Therefore, a relatively great amount of current SB1 flows. This increases a read error rate of the dummy cell maximally to be quickly reflected in the normal memory cell.

Referring to FIG. 9, a gate of an NMOS transistor NM11 is connected (to a VCMP+a voltage source) to receive a clamping voltage VCMP+a that causes current to flow in a first direction SA1. In this respect, the level of the voltage may be 0.1V, for example. The level of the clamping voltage VCMP+a applied to the dummy memory cell is higher than that of the clamping voltage VCMP applied to the normal memory cell. Therefore, a relatively great amount of current SA1 flows. This increases a read error rate of the dummy cell maximally so as to be quickly reflected in the normal memory cell.

Reference is again made to FIG. 3, in which reference symbols 'a2' and 'b2' show the resistance, voltage and read current characteristics of the dummy memory cell 6.

When the dummy memory cell 6 of FIG. 9 is operating normally, a first dummy cell sign detection signal +D.C of logic level 'H' is produced so that the first switch SW1 in the circuit of FIG. 7 is closed. Thus, the read current for reading the data stored at the MTJ 5 flows in a forward direction until the logic level of the first dummy cell sign detection signal +D.C is changed.

The level of the first dummy cell sign detection signal +D.C changes over time due to the iterative supply of current in the same direction. In this case, a second switch SW2 may be closed. The level of the second dummy cell sign detection signal −D.C changes through a circuit of FIG. 8 whenever the second switch SW2 is closed.

There is described an example in which a direction of the read current is switched from the first direction to the second direction or from the second direction to the first direction by checking a characteristic variation under the condition that the dummy cell operates at the worst circumstance.

Another embodiment of the inventive concept will now be described with reference to FIG. 10. In this embodiment, a temperature sensor is used to change the direction of the read current.

Figure 10:
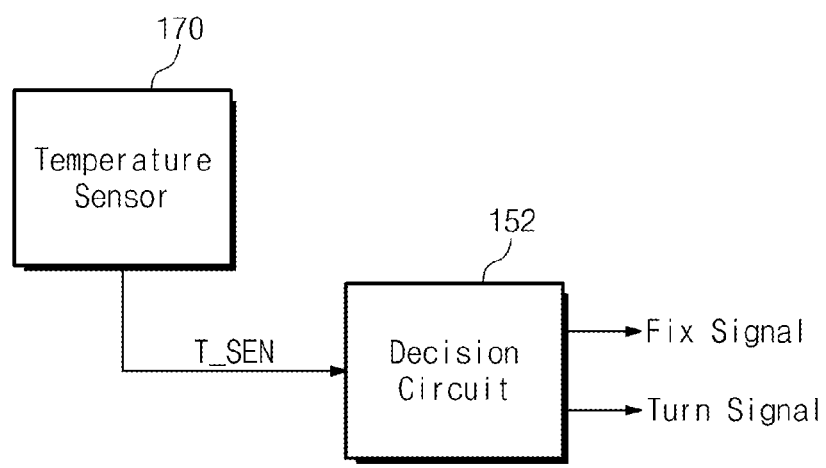
FIG. 10 is a block diagram of another embodiment of a switching signal generating unit for use in executing a read method according to the inventive concept.

Referring to FIG. 10, a temperature sensor 170 is disposed adjacent the memory cell array to sense a temperature of a particular memory cell or of the array in general. A decision circuit 152 is operatively connected to the temperature sensor 170 to receive a temperature signal T_SEN output by the sensor 170 and is configured to determine the direction in which a read current should flow based on the signal T_SEN. In particular, the decision circuit 152 generates a direction fix signal or a direction turn signal in response to the temperature signal T_SEN from the temperature sensor 170.

In this example, the direction turn signal is generated when the temperature signal T_SEN indicates that the sensed temperature is higher than a reference temperature. In this case, the direction of the read current is changed whenever a read command is subsequently received. On the other hand, the direction fix signal is generated when the temperature signal T_SEN indicates that the sensed temperature is lower than the reference temperature. In this case, the read current continues to flow in the same direction until a direction turn signal is generated in response to a change in the temperature signal T_SEN.

The temperature signal T_SEN output by the temperature sensor 170 may have a value of '0' when the memory cell (array) is relatively cold (in a range at or below the reference temperature) and a value of '1' when the memory cell (array) is relatively hot (in a range above the reference temperature). As a result, the decision circuit 152 may output a signal having logic level 'H' as the direction turn signal when the memory cell (array) is relatively hot, and the decision circuit 152 may output a signal having a logic level 'L' as the direction fix signal when the memory cell (array) is relatively cold.

An embodiment of a magnetic memory device to which the inventive concept can be applied will now be described with reference to FIG. 11.

The magnetic memory device of this embodiment includes a memory cell array 110, an address decoder 120, a read/write circuit 130, a data input/output circuit 140, a control circuit 150, a voltage generating circuit 160, and a temperature sensor 170.

The memory cell array 110 includes a matrix of memory cells connected between bit and source lines. Each memory cell is formed of an access transistor and a magnetic tunnel junction (MTJ) element. The MTJ element may be sensitive to temperature variations. The memory cell array 110 may also include a dummy cell of the type described above with reference to FIGS. 6, 8 and 9.

The temperature sensor 170 is operative to sense a temperature of the memory cell array 110 (e.g., of a specific memory cell of the array or of the temperature of the array in general) and to generate a temperature sensing signal representative of the sensed temperature. For example, the temperature sensor 170 may basically generate information indicative of whether the array is relatively hot (i.e., when the sensed temperature is higher than a reference) temperature or cold (when the temperature lower than the reference temperature. To this end, the temperature sensor 170 may output a signal of a level '1' when the sensed temperature is relatively high and a signal of a level '0' when the sensed temperature is relatively low. However, the inventive concept is not so limited. For example, the temperature sensor 170 may be configured to output sensing signals of plurality of bits and representing different temperature ranges, respectively.

The voltage generating circuit 160 is configured to generate a read voltage in a read operation and a write voltage in a write operation.

The address decoder 120 decodes row and column addresses for selecting rows and columns of the memory cell array 110. A specific memory cell of the array 110 may thus be selected according to a decoding operation of the address decoder 120. The address decoder 120 may also include a pre-decoder for pre-decoding of an address.

The read/write circuit 130 reads data from a selected memory cell in a read operation and writes data onto a selected memory cell in a write operation. The write operation may include set and reset operations. Data '0' may be stored at a selected memory cell in a set operation of the write operation. Data '1' may be stored in a selected memory cell in a reset operation of the write operation.

The data input/output circuit 140 outputs read data to an input/output port I/O in a read operation and transfer write data received in a write operation to the read/write circuit 130.

The control circuit 150 decodes a command provided from a command buffer (such as that designated by reference numeral 50 in FIG. 5) to control a read or write operation of the magnetic memory device 100. In a write operation, the control circuit 150 may control the voltage generating circuit 160 and the read/write circuit 130 such that write data is written onto a selected memory cell of the memory cell array 110. In a read operation, the control circuit 150 may control the voltage generating circuit 160 and the read/write circuit 130 such that write data is read out from a selected memory cell of the memory cell array 110. The control circuit 150 performs a read control operation that minimizes or reduces the read error rate (RER) of the magnetic memory device 100. Hence, the control circuit 150 may comprise any of the circuitry/units described above with reference to FIGS. 5-10.

Figure 12:
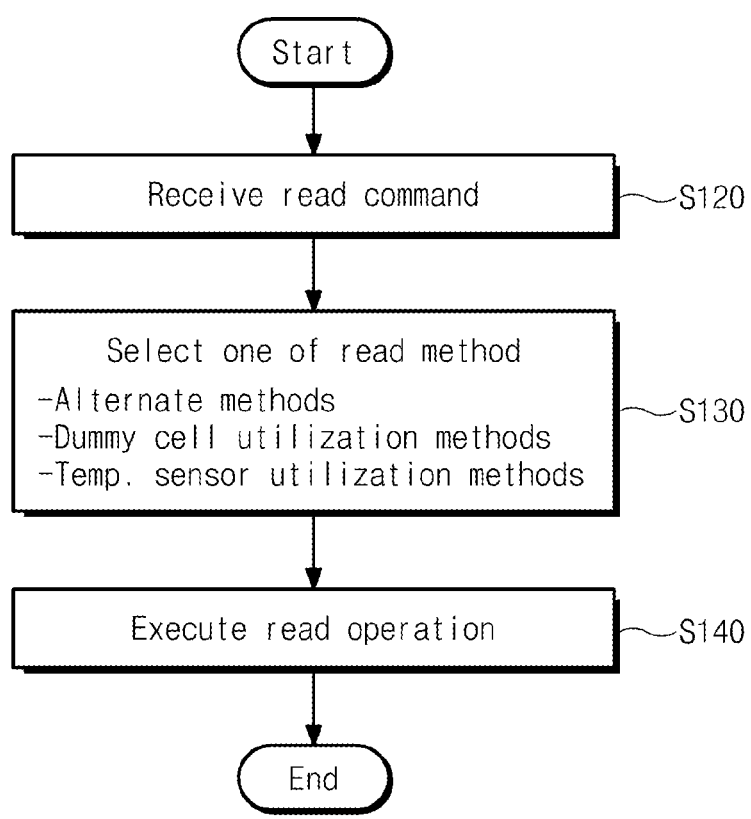
FIG. 12 is a flow chart illustrating the embodiments of read methods according to the inventive concept.

The read control operation will now be described with reference to FIG. 12.

First, the control circuit 150 receives a read command (S120).

Next, the control circuit 150 decides (S130) the mode of the read operation, i.e., which read method is to be implemented in determining when to change the direction of the read current.

For example, in operation S130, an alternate (current supplying) method may be employed. On the other hand, a dummy memory cell utilization method is employed if a variation of a characteristic of a dummy memory cell is detected while a read current is iteratively supplied thereto in one of first and second directions. Also, in S130, a temperature sensor utilization method may be employed if a temperature signal output by the temperature sensor 170 is relatively high (above a reference temperature).

One of the above-described methods may be selected through the use of an anti-fuse box, a metal option, or a mode register set.

Next, a read operation is carried out (S140) under the read method selected. During the read operation, read current is selectively supplied in the first and second directions according to the selected read method, and the magnitude of the read current flowing through selected ones of the MJT elements of the memory cells is sensed to read data stored at the selected memory cell(s).

A magnetic memory device having a magnetic memory cell, e.g., an STT-MRAM cell, to which the inventive may be applied will now be described in detail with reference to FIG. 13.

The STT-MRAM cell includes a magnetic tunnel junction (MTJ) element 105, a transistor 110, a bit line 120, and a word line 130. For example, the MTJ element 105 has a pinned layer and a free layer separated by a thin insulation (tunnel barrier) layer and each generating a magnetic field. A source line 140 may be connected to the transistor 110 through a line 114.

A sense amplifier 155 amplifies the difference between the signal levels of the signals input thereto from a bit line reference 175 and the bit line 120. A read/write circuit 165 is connected between the bit line 120 and the source line 140.

The MTJ element 105 may be grown on a metal layer referred to as a bottom electrode (BE) plate 180, and the bottom electrode plate 180 may be connected to an upper portion 112 of the transistor 110 through a seed (not shown). Mechanical surface characteristics (e.g., flatness or roughness) of the bottom electrode plate 180 may influence the performance of the MTJ element 105. The bottom electrode plate 180 may be formed of stiff polished metal, for example, a titanium alloy having mechanical characteristics suitable to form on it the MTJ storage element 105 or metal similar thereto.

The STT-MRAM is a known category of devices that employ a technique in which electrons are spin-polarized, and the spin-polarized electrons are used to change the direction of magnetization of a magnetic layer, in contrast to conventional MRAMs that use a magnetic field to change the direction of magnetization. Both STT-MRAMS and conventional MRAMs employ magnetic tunnel junction (MTJ) elements.

A tunneling current flowing through (or tunneling resistance of) the MTJ is dependent on a magnetization state of a ferromagnetic material making up the MTJ. The ferromagnetic material may include a free layer and a pinned layer with the MTJ interposed therebetween. The tunneling resistance is low when magnetization directions of the free and pinned layers are parallel and high when magnetization directions of the free and pinned layers are anti-parallel. An anti-ferromagnetic layer called a pinning layer may be provided in addition to the pinned layer. In this case, a magnetization direction of the pinned layer may be fixed and the tunneling resistance varies depending on the magnetization direction of the free layer. The magnetization direction of the free layer may be switched by a magnetic field formed by currents flowing along a bit line and a word line. As a resistive memory device becomes more highly integrated, coercivity of the free layer increases. This may cause unwanted switching of the free layer. Thus, there is a growing interest in developing magnetic memory devices using a spin transfer torque manner or a magnetic memory device using a toggle switching writing manner.

As described above, a magnetic memory device using a spin transfer torque technique switches the magnetization direction of a free layer of an MTL element in a magnetic memory cell by directing current through a pinned magnetic layer which polarizes the direction of spin of the electrons, and then transferring the spin momentum of electrons to the free layer. The amount of current required to spin polarize the electrons is relatively small with respect to the size of the cell. Thus, the memory device may be highly integrated.

In a more specific example of such a device, a word line and a bit line extend in respective directions which cross each other at an angle of 40°, and an MTJ element electrically connected to and between the word and bit lines includes a second magnetic area, a tunneling barrier, and a first magnetic area which are sequentially stacked. The first and second magnetic areas may be an SAF (Synthetic Anti-Ferromagnetic) structure which includes an upper ferromagnetic layer, a lower ferromagnetic layer, and a diamagnetic coupling spacer layer inserted between the upper ferromagnetic layer and the lower ferromagnetic layer.

Figure 13:
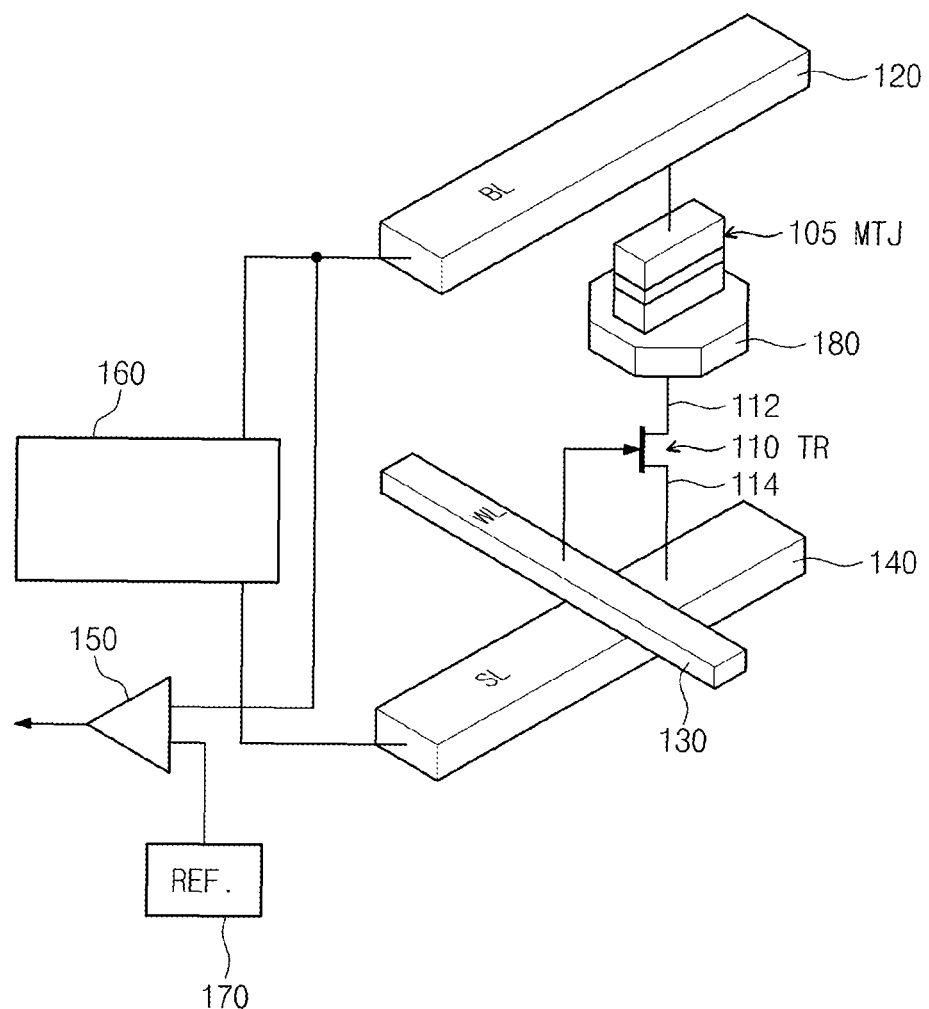
FIG. 13 is a schematic diagram of an MRAM device to which the inventive concept can be applied.
Figure 14:
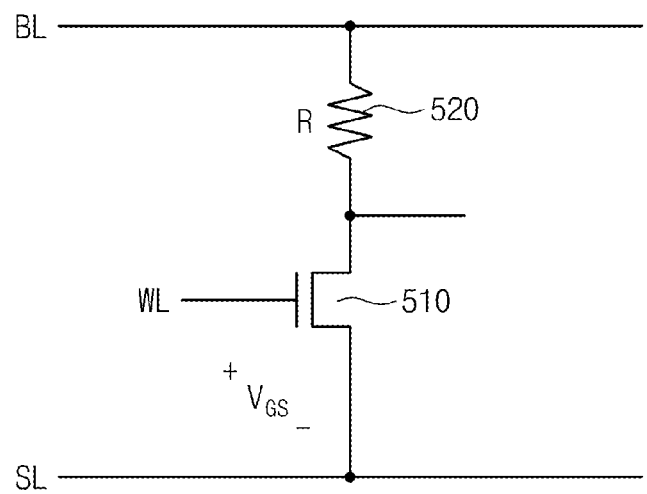
FIG. 14 is an equivalent circuit diagram of the memory cell of the MRAM of FIG. 13.

FIG. 14 is an equivalent circuit diagram of a memory cell of FIG. 13.

Referring to FIG. 14, the STT-MRAM cell includes MTJ element 520 (data storage element) and an access transistor 510. The MTJ 520 may be represented as a (variable) resistor. A word line WL is connected to the access transistor 510. The access transistor 510 and the MTJ element 520 are disposed between a bit line BL and a source line SL. During a write operation, data "0" may be stored under the condition that WL=H, BL=H, and SL=L, and data "1" may be stored under the condition that WL=H, BL=L, and SL=L. In this example, "H" is a high voltage/logic level, and "L" is a low voltage/logic level. Voltage levels may be supply voltage levels (e.g., Vdd and 0V) or higher or lower than the supply voltage levels.

Figure 15:
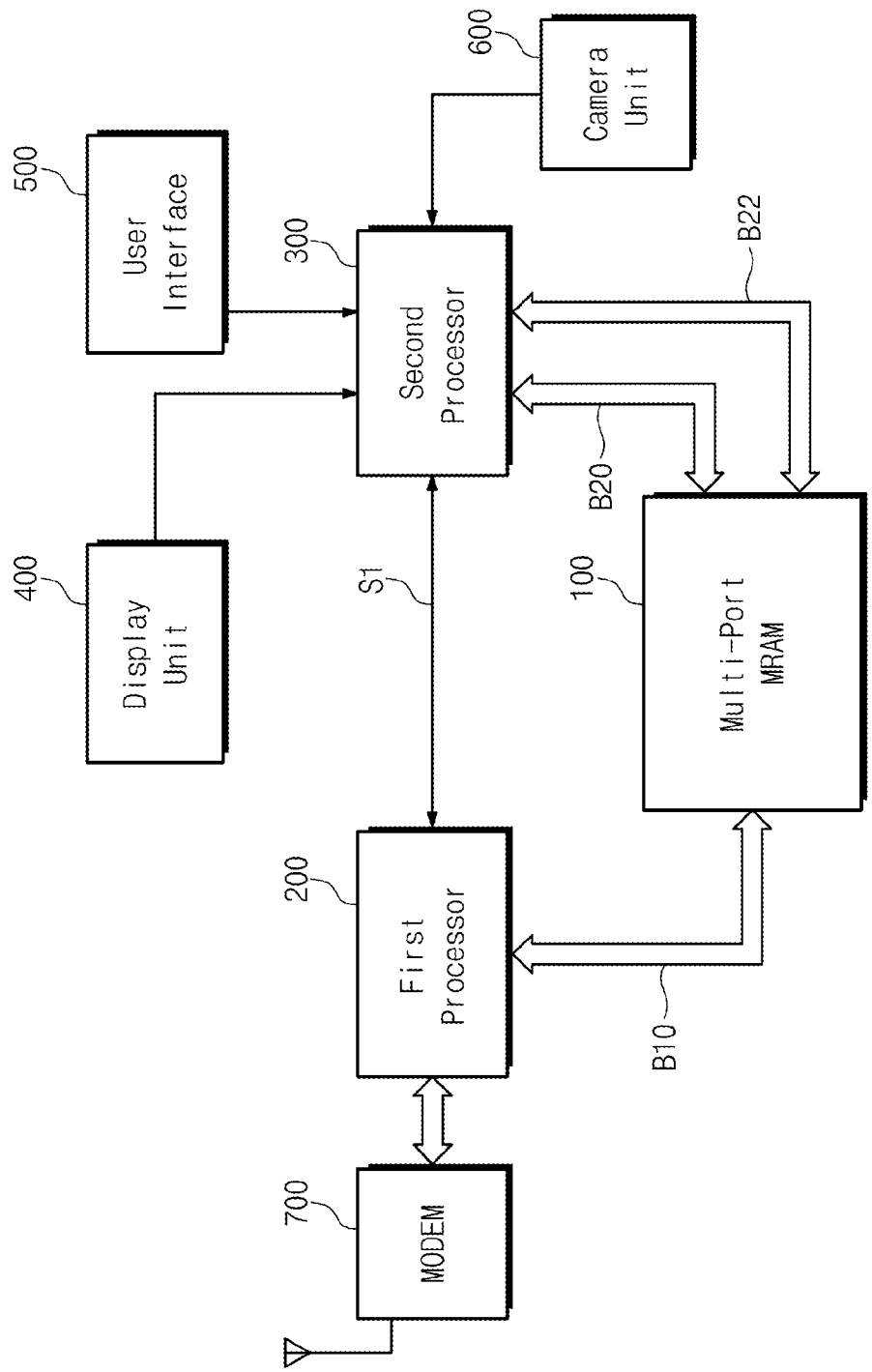
FIG. 15 is a block diagram of a mobile device to which the inventive concept is applied.

FIG. 15 is a block diagram of a mobile device to which the inventive concept is applied. The mobile device may be a cellular phone, a tablet PC, or a notebook computer, for example.

Referring to FIG. 15, this example of a mobile device includes a multi-port MRAM 100, a first processor 200, a second processor 300, a display unit 400, a user interface 500, a camera unit 600, and a modem 700.

The multi-port MRAM 100 may have three ports respectively connected with first to third buses B10, B20, and B22, and may be connected with the first and second processors 200 and 300. The first port of the multi-port MRAM 100 may be connected with the first processor 200 (e.g., a baseband processor) through the first bus B10. The second port of the multi-port MRAM 100 may be connected with the second processor 300 (e.g., an application processor) through the second bus B20. The third port of the multi-port MRAM 100 may be connected with the second processor 300 through the third bus B22.

The multi-port MRAM 100 replaces one storage memory (e.g., a flash memory) and two DRAMs in a conventional mobile device. Thus, the device may be relatively small, and the device is less costly to produce.

Figure 11:
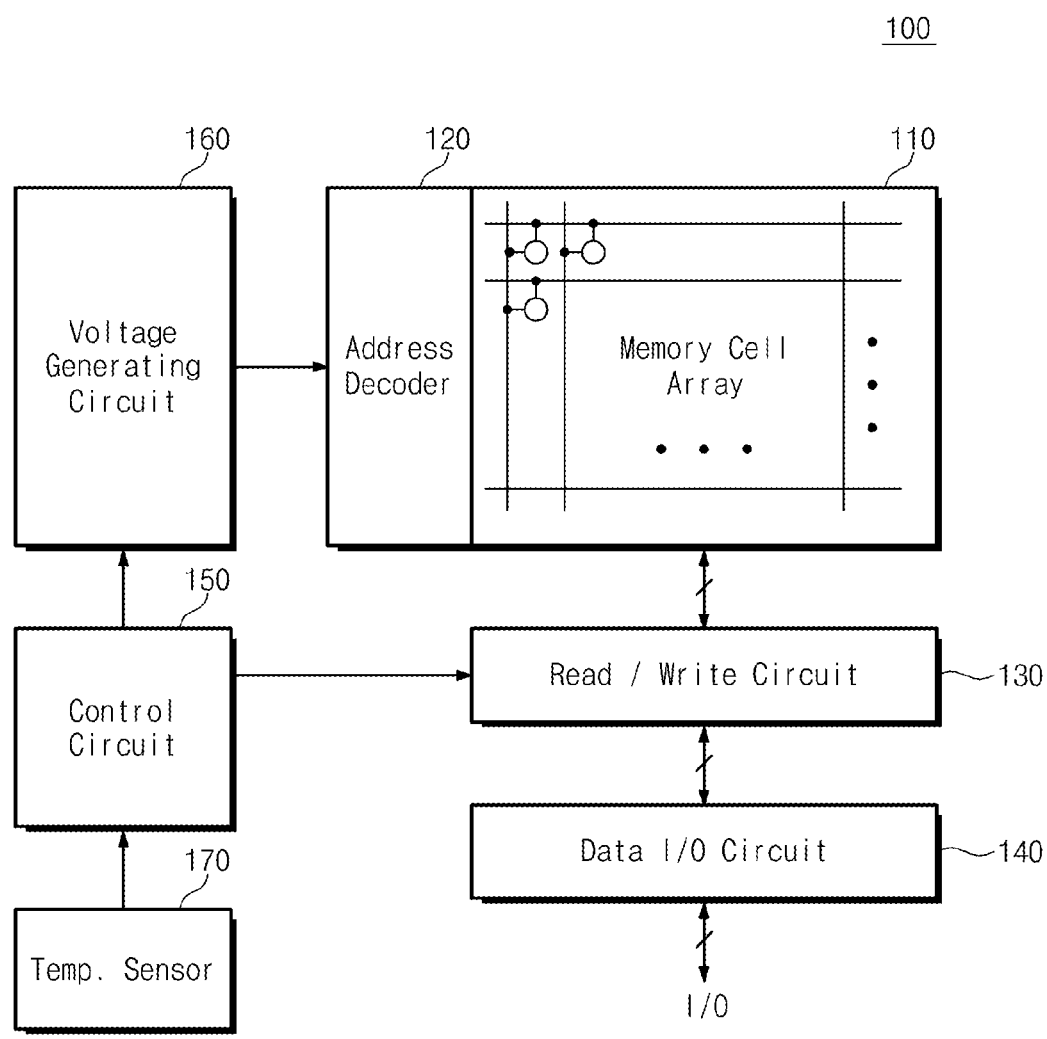
FIG. 11 is a block diagram of an embodiment of a magnetic memory device according to the inventive concept.

In this embodiment, the multi-port MRAM 100 is realized according to any of the embodiments of the MRAM devices, e.g., the device of FIG. 11, described above. Thus, the read error rate is minimal. In addition, the compatibility of the device is improved because it can be used without connecting and disconnecting the MRAM 110 to and from existing processors.

An interface of the first bus B10 may be a volatile memory interface, and the first port may receive first packet data DQ1/ADDR1/CMD1 generated from the first processor 200 to transfer it to an internal circuit block of the multi-port MRAM 100. Also, the first port may provide first data of the multi-port MRAM 100 to the first processor 200. In this case, the first data may be parallel data.

An interface of the third bus B22 may be a volatile memory interface, and the third port may receive third packet data DQ3/ADDR3/CMD3 generated from the second processor 300 to transfer it to an internal circuit block of the multi-port MRAM 100. Also, the third port may provide third data of the multi-port MRAM 100 to the second processor 300.

In this case, the first and third data may be serial data or parallel data. A clock generator (not shown) may generate a first internal clock signal ICLK1 and a third internal clock signal ICLK3 based on an external clock signal CLK. In this case, the frequency of the first internal clock signal ICLK1 may be different from that of the third internal clock signal ICLK3.

In addition, an interface of the second bus B20 may be a nonvolatile memory (e.g., a NAND flash) interface, and the second port may receive second packet data DQ2/ADDR2/CMD2 generated from the second processor 300 to transfer it to an internal circuit block of the multi-port MRAM 100. Also, the second port may provide second data of the multi-port MRAM 100 to the second processor 300. In this case, the second data may be serial data or parallel data.

In some cases, the first and second processors 200 and 300 and the MRAM 100 may be integrated in a single chip or package. In these cases, the MRAM 100 may be embedded in the mobile device.

If the mobile device is a handheld communications device, the first processor 200 may be connected with the modem 700 which transmits and receives communications data and modulates and demodulates data.

A NOR or NAND flash memory may be additionally connected to the first processor 200 or the second processor 300 to store mass information.

The display unit 400 may comprise a liquid crystal display having a backlight, a liquid crystal display having an LED light source, or a touch screen (e.g., OLED). The display unit 400 may be an output device for displaying images (e.g., characters, numbers, pictures, etc.) in color.

The mobile device may be connected with an external communications device through a separate interface. The communications device may be a DVD player, a computer, a set top box (STB), a game console, a digital camcorder, or the like.

Although not shown in FIG. 9, the mobile device may further include an application chipset, a camera image processor (CIS), a mobile DRAM, etc. For example, the camera unit 600 may include a camera image processor (CIS), and may be connected with the second processor 300.

In the case in which the MRAM 100 is embodied as a chip, the chip may be packaged in various ways. For example, the chip may be packed as part of a PoP (Package on Package), Ball grid array (BGA) package, Chip scale package (CSP), Plastic Leaded Chip Carrier (PLCC), Plastic Dual In-Line Package (PDIP), Die in Waffle Pack, Die in Wafer Form, Chip On Board (COB) package, Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline (TSOP), System In Package (SIP), Multi-Chip Package (MCP), Wafer-level Fabricated Package (WFP), Wafer-Level Processed Stack Package (WSP), or the like.

Figure 16:
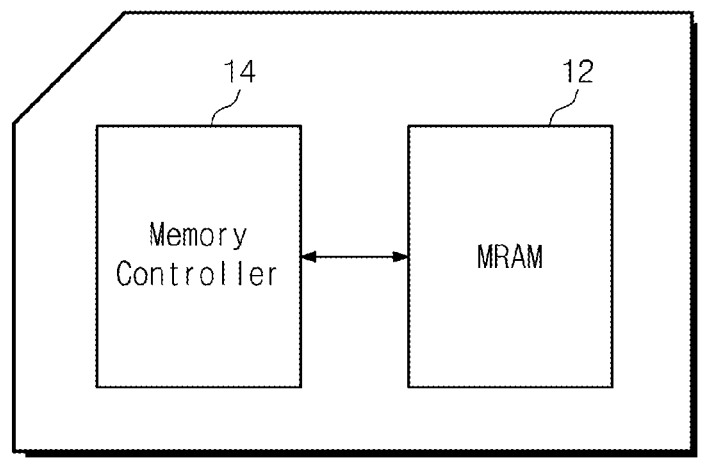
FIG. 16 is a block diagram schematically of a smart card including a magnetic memory device according to the inventive concept.

FIG. 16 illustrates a smart card 10 including an embodiment of a magnetic memory device according to the inventive concept.

Referring to FIG. 16, the smart card 10 includes a memory controller 14 and a semiconductor memory device 12. The semiconductor memory device 12 is an MRAM according to the inventive concept as described above. The memory controller 14 may write data necessary for the smart card 10 onto the MRAM 12. At an input of a read command, the MRAM 12 reads data stored at a selected magnetic memory cell according to any of the read schemes of the inventive concept described above. That is, the data is read by selectively applying a read current to the selected magnetic memory cell in one of a first direction and a second direction and sensing the magnitude of the current flowing from an MTJ element of the memory cell.

Figure 17:
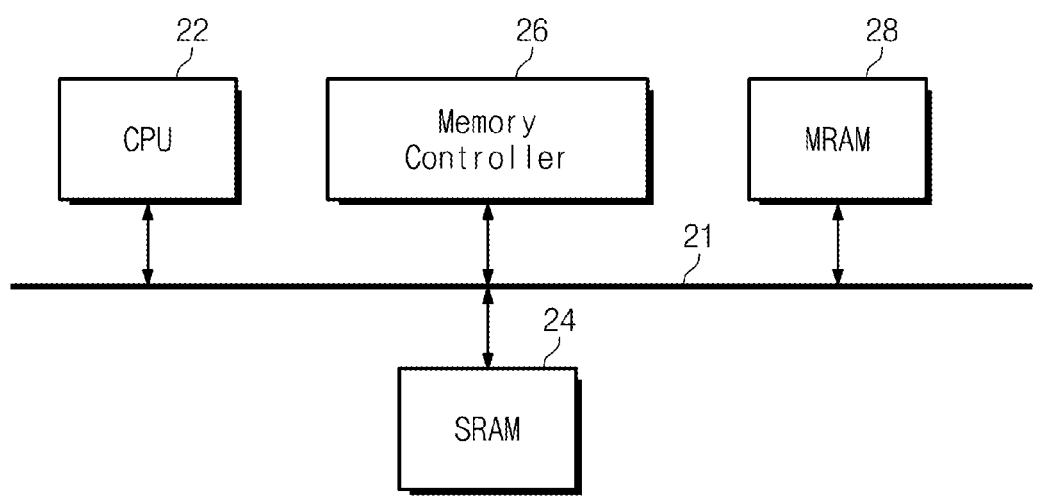
FIG. 17 is a block diagram of a memory system including a magnetic memory device according to the inventive concept.

FIG. 17 illustrates a memory system 20 including an embodiment of a magnetic memory device according to the inventive concept.

Referring to FIG. 17, the memory system 20 includes a CPU 22, an SRAM 24, a memory controller 26, and an MRAM 28 which are electrically connected with a bus 21. In this system, as well, data stored in the MRAM 28 is read in a scheme according to the inventive concept.

N-bit data (N being an integer equal to or greater than 1) processed or to be processed by the CPU 22 may be stored in the MRAM 28 through the memory controller 26. Although not shown in FIG. 17, the memory system 20 may further comprise an application chipset, a camera image processor (CIS), or a mobile DRAM. The memory controller 26 and the resistive memory device 28 may constitute a solid state drive (SSD), for example.

Because the MRAM 12 of the smart card of FIG. 16 and the MRAM 28 of the system of FIG. 17 are configured such that read current flows in forward and reverse directions over the course of a series of reads in a read operation, read error rate is minimized. That is, the reliability of a smart card or system may be improved according to the inventive concept.

Figure 18:
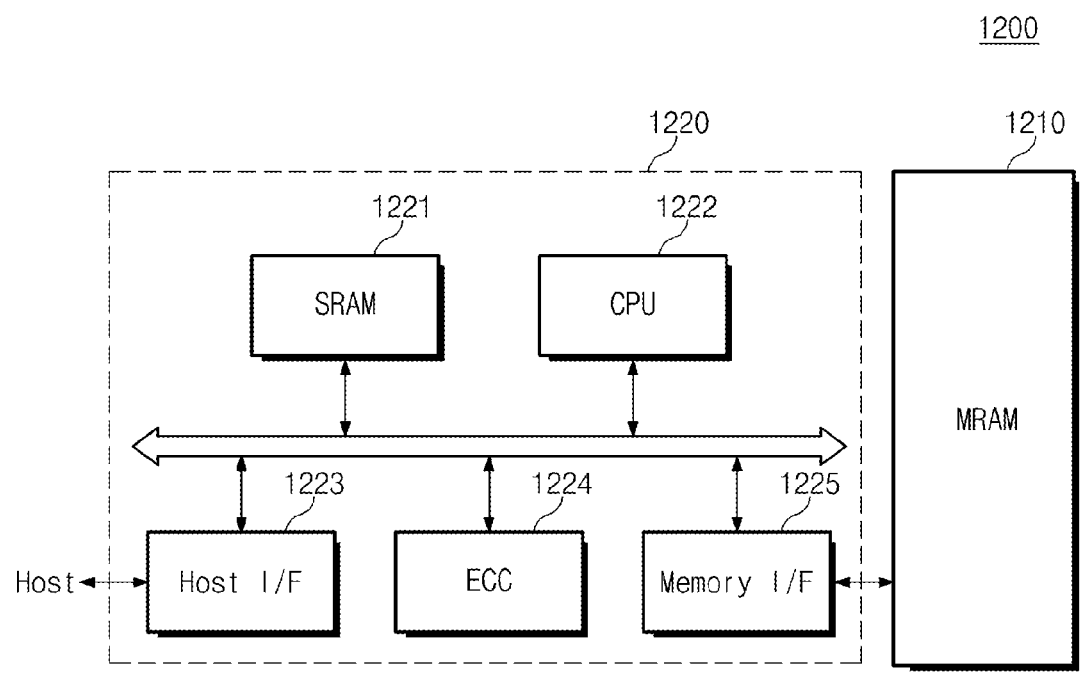
FIG. 18 is a block diagram a memory card to which the inventive concept is applied.

FIG. 18 illustrates the inventive concept as applied to a memory card 1200.

An embodiment of An MRAM 1210 according to the inventive concept is employed by the memory card 1200. Also, the memory card 1200 includes a memory controller 1220 which controls data exchange between a host and the MRAM 1210.

In the memory controller 1220, an SRAM 1221 may be used as a working memory of a CPU 1222. A host interface 1223 may provide the data exchange protocol between the host and the memory card 1200. An ECC block 1224 detects and correct an error included in data read from the MRAM 1210. A memory interface 1225 may provide an interface between the MRAM 1210 and the memory controller 1220. The CPU 1222 may perform an overall control operation for data exchange of the memory controller 1220.

In a read operation, read current is supplied to a selected memory cell of the MRAM 1210 in a scheme according to the inventive concept (selectively in forward and reverse directions). Thus, a read error rate due to a variation in a characteristic of a magnetic tunnel junction element is reduced, and the performance of the memory card 1200 is enhanced.

Figure 19:
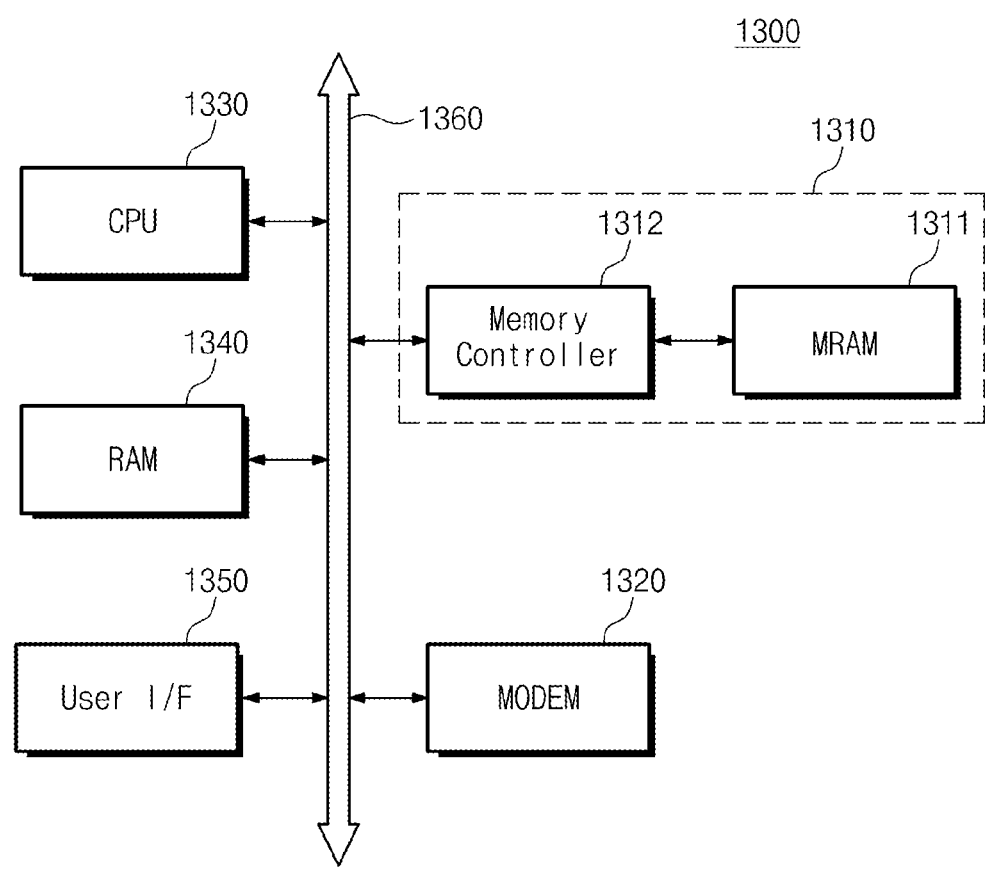
FIG. 19 is a block diagram of an information processing system to which the inventive concept is applied.

FIG. 19 illustrates the inventive concept as applied to an information processing system 1300. The information processing system 1300 may constitute a mobile device or a computer.

Referring to FIG. 19, the information processing system 1300 includes a memory system 1310 which has an embodiment of an MRAM 1311 according to the inventive concept. The memory system 1310 may be realized in the form of a solid state drive (SSD). In this case, the information processing system 1300 may store mass data stably and reliably in the memory system 1310.

In addition, the information processing system 1300 may include a MODEM 1320, a CPU 1330, a RAM 1340, and a user interface 1350 which are electrically connected with a system bus 1360. Data processed by the CPU 1330 or data input from an external device may be stored in the memory system 1310. The information processing system 1300 may further comprise a camera image sensor, an application chipset, etc.

In a read operation, read current is supplied to a selected memory cell of the MRAM 1311, constituting the memory system 1310 together with a memory controller 1312, in a scheme according to the inventive concept (selectively in forward and reverse directions). Thus, a read error rate due to a variation in a characteristic of a magnetic tunnel junction element is reduced, and the performance of the information processing system 1300 is enhanced.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A data reading method of a magnetic memory device comprising:

issuing a series of successive read commands each of which commands that data stored in a selected magnetic memory element be read;

controlling the direction in which a read current flows through the selected magnetic memory element, including periodically changing the direction in which the read current will flow through the selected magnetic memory element between first and second opposite directions;

before the direction in which the read current will flow through the selected magnetic memory element is changed from the first direction to the second direction:

supplying a read current to the selected magnetic memory element in the first direction in response to the issuance of a respective one of the read commands, and sensing the magnitude of the current flowing from the selected magnetic memory element in the first direction to read data stored in the selected magnetic memory element; and after the direction in which the read current will flow through a selected magnetic memory element is changed from the first direction to the second direction:

supplying a read current to the selected magnetic memory element in the second direction in response to the issuance of another of the read commands, and sensing the magnitude of the current flowing from the selected magnetic memory element in the second direction to read data stored in the selected magnetic memory element.

2. The data reading method of claim 1, wherein the periodic changing of the direction in which the read current will flow through the selected magnetic memory element comprises changing the direction from the first direction to the second direction each time an odd-numbered one of the read commands in the series of successive read commands is issued, and changing the direction from the second direction to the first direction each time an even-numbered one of the read commands in the series of successive read commands is issued.

3. The data reading method of claim 1, wherein the periodic changing of the direction in which the read current will flow through the selected magnetic memory element comprises changing the direction when a characteristic of a dummy memory element changes.

4. The data reading method of claim 1, wherein the periodic changing of the direction in which the read current will flow through the selected magnetic memory element comprises changing the direction in response to a temperature signal generated by a temperature sensor.

5. The data reading method of claim 4, wherein the direction in which the read current will flow through the selected magnetic memory element is changed periodically only once the temperature signal indicates a temperature higher than a reference temperature, and comprises changing the direction in which the read current is supplied through the selected magnetic memory element between the first and second directions each time one of the read commands is generated as long as the temperature is indicated as remaining higher than the reference temperature.

6. The data reading method of claim 4, wherein as long as the temperature signal indicates a temperature lower than a reference temperature, the read current is supplied in only the first direction whenever one of the read commands is generated.

7. The data reading method of claim 5, wherein as long as the temperature signal indicates a temperature lower than a reference temperature, the read current is supplied in only the first direction whenever one of the read commands is generated.

8. A magnetic memory device comprising:

a read command generating unit that generates read commands;

a memory cell array including a matrix magnetic memory cells connected between bit and source lines, each of the magnetic memory cells including a magnetic memory element;

a read circuit operatively connected to the read command generating unit so as to receive the read commands therefrom, the read circuit being configured to read data stored in a selected magnetic memory element of the memory cell array by supplying a read current to the selected magnetic memory element and sensing the magnitude of the read current flowing from the select magnetic memory element in response to one of the read commands; and a control circuit operatively interconnected between the memory array and the read circuit, the control circuit being configured to control the direction in which the read current is supplied to the selected magnetic memory element, and to periodically change the direction in which the read current is supplied through the selected magnetic memory element between first and second opposite directions in which the read current flows to and from the source line, respectively, to which the selected magnetic memory element is connected.

9. The magnetic memory device of claim 8, wherein the control circuit is configured to change the direction in which the read current is supplied through the selected magnetic memory element from the first direction to the second direction whenever an odd-numbered one of the read commands in a series of successive ones of the read commands is generated, and to change the direction in which the read current is supplied through the selected magnetic memory element from the second direction to the first direction whenever an even-numbered one of the read commands in the series is generated.

10. The magnetic memory device of claim 8, wherein the memory cell array includes a dummy magnetic memory element, and the control circuit is operatively connected to the dummy magnetic memory element and is configured to change the direction in which the read current will flow through the selected magnetic memory element when a characteristic of the dummy memory element changes.

11. The magnetic memory device of claim 8, further comprising a temperature sensor operatively associated with the memory cell array so as to sense a temperature in the array and output a temperature signal indicative of a level of the sensed temperature, and wherein the control circuit is operatively connected to the temperatures sensor to receive the temperature signal, and the control circuit is configured to change the direction in which the read current will flow through the selected magnetic memory element in response to a temperature signal generated by a temperature sensor.

12. The magnetic memory device of claim 11, wherein the control circuit is configured to periodically change the direction in which the read current will flow through the selected magnetic memory element only once the temperature signal indicates a sensed temperature higher than a reference temperature, and change the direction in which the read current is supplied through the selected magnetic memory element between the first and second directions each time one of the read commands is generated as long as the sensed temperature is indicated as remaining higher than the reference temperature.

13. A magnetic memory device comprising:
a memory cell including a magnetic memory element having a variable resistance, and a selection device electrically connected to the magnetic memory element and operable to select the magnetic memory element during a read operation in which data stored in the element is to be read, and
wherein the magnetic memory element has a first end and a second end;
a source line electrically connected to the magnetic memory element at the first end thereof;
a read current driving circuit having a first node electrically connected to the magnetic memory element at the second end thereof, a first switch electrically connecting the first node and voltage source, and a second switch electrically connecting the first node to a ground;
a read command generating unit that generates read commands; and
a switching unit operatively connected to the read current drive circuit and operative to effect first and second switching operations in succession during the course of a read operation in which data stored in the magnetic memory element is read a number of times in response to the read commands,
wherein the first switching operation results in a state of the read current driving circuit in which the first switch is open and the second switch is closed, and the second switching operation results in a state of the read current driving circuit in which the second switch is open and the first switch is closed.

14. The magnetic memory device of claim 13, wherein the magnetic memory element has a free layer, a pinned layer, and a magnetic tunnel junction between the free and pinned layers.

15. The magnetic memory device of claim 14, wherein the free layer is located at the first end of the magnetic memory element, and the pinned layer is located at the second end of the magnetic memory element.

16. The magnetic memory device of claim 13, wherein the switching unit comprises a counter connected between the read command generating unit and the read current driving circuit.

17. The magnetic memory device of claim 13, wherein the switching unit comprises: a magnetic dummy memory cell having a first end at which the magnetic dummy memory cell is electrically connected to the source line, and a second end, and
a dummy memory cell read current driving circuit electrically including a second node electrically connected to the magnetic dummy memory cell at the second end thereof, the second node being electrically connected between the voltage source and a ground.

18. The magnetic memory device of claim 13, wherein the switching unit comprises a temperature sensor that senses a temperature in the magnetic memory device and outputs a temperature signal indicative of a level of the sensed temperature, and a decision circuit operatively connected to the temperature sensor to receive the temperature signal therefrom and operative to output a signal whose level varies depending on the level of the sensed temperature.

19. The magnetic memory device of claim 18, wherein the decision circuit is operative to output a fix signal to the read current driving circuit as long as the sensed temperature is no greater than a reference temperature, and a turn signal to the read current driving circuit whenever the sensed temperature is no greater than a reference temperature, and the read current driving circuit performs the first and second switching operations in succession during the course of a read operation in response to the turn signal but does not open or close either of the switches of the read current driving circuit in response to the fix signal.

* * * * *